(12) United States Patent
Reynolds et al.

(10) Patent No.: US 7,583,092 B2
(45) Date of Patent: Sep. 1, 2009

(54) CAPACITIVE SENSING APPARATUS THAT USES A COMBINED GUARD AND SENSING ELECTRODE

(75) Inventors: Joseph K. Reynolds, Sunnyvale, CA (US); Tracy S. Dattalo, Santa Clara, CA (US)

(73) Assignee: Synaptics Incorporated, Santa Clara, CA (US)

( * ) Notice: Subject to any disclaimer, the term of this patent is extended or adjusted under 35 U.S.C. 154(b) by 260 days.

(21) Appl. No.: 11/888,170

(22) Filed: Jul. 30, 2007

(65) Prior Publication Data

US 2009/0033343 A1  Feb. 5, 2009

(51) Int. Cl.
*G01R 27/26* (2006.01)
(52) U.S. Cl. .................... 324/688; 324/686
(58) Field of Classification Search ........... 324/688, 324/686, 658, 649, 600, 661, 662, 663, 671, 324/548; 340/562, 545.4; 73/1.79, 780, 73/718, 724, 862.337, 862.626, 514.32; 702/47, 702/52, 150
See application file for complete search history.

(56) References Cited

U.S. PATENT DOCUMENTS

| | | | |
|---|---|---|---|
| 5,730,165 A | 3/1998 | Philipp | |
| 5,861,583 A | 1/1999 | Schediwy et al. | |
| 7,116,117 B2 * | 10/2006 | Nakano et al. | 324/688 |
| 7,262,609 B2 * | 8/2007 | Reynolds | 324/678 |
| 7,545,153 B2 * | 6/2009 | Abe | 324/663 |

OTHER PUBLICATIONS

"Secrets of Successful Qtouch Design", *Quantum Research Application Note AN-KD02*, (Oct. 2005),p. 1-11.

* cited by examiner

*Primary Examiner*—Hoai-An D Nguyen

(57) ABSTRACT

A capacitive sensing apparatus includes capacitive sensor electrodes, and a combined guard and sensing electrode that is disposed proximate to the capacitive sensor electrodes. The combined guard and sensing electrode has at least a first operating mode and a second operating mode. In the first operating mode, the combined guard and sensing electrode can detect an object at a distance that is greater than the distance at which the object can be sensed by the capacitive sensor electrodes. In the second operating mode, the combined guard and sensing electrode can electrically guard the capacitive sensor electrodes.

28 Claims, 6 Drawing Sheets

400

```
┌─────────────────────────────────────┐
│   PLACE COMBINED GUARD AND SENSING  │
│  ELECTRODE IN 1ST OPERATING MODE UNTIL │
│     A PROXIMATE OBJECT IS DETECTED  │
│                 410                 │
└─────────────────────────────────────┘
                  │
                  ▼
┌─────────────────────────────────────┐
│    TRANSITION THE COMBINED GUARD AND │
│  SENSING ELECTRODE TO A 2ND OPERATING │
│    MODE IN RESPONSE TO DETECTING A  │
│           PROXIMATE OBJECT          │
│                 420                 │
└─────────────────────────────────────┘
```

FIG. 4

CAPACITIVE SENSING APPARATUS THAT USES A COMBINED GUARD AND SENSING ELECTRODE

BACKGROUND

Conventional consumer electronic devices enable a user to input a choice or a selection in different ways. For example, a user can use buttons, an alphanumeric keyboard, or a cursor control device (e.g., a mouse) to indicate a choice or selection. Moreover, touch sensing technology can be used to provide inputs to a computing device or other types of electronic devices. Within the broad category of touch sensing technology there exist capacitive interfaces, including buttons, one-dimensional sensors, and two-dimensional strips or pads that can be used for navigation and scrolling.

Proximity detection is a useful addition to a user interface. For example, conventional electronic devices typically enter a low power (e.g., "sleep") mode after a prescribed period of inactivity. Some conventional electronic devices do not awake from the sleep mode until the user interface is touched by a user—the user can push a key on a keyboard or move a mouse, for example. With proximity detection, the user would not have to make contact with the user interface in order to awaken the electronic device—instead, as the user's finger or hand is brought within range of the user interface, the electronic device is awakened.

To demonstrate the usefulness of proximity detection, consider an example of a conventional battery-powered cell phone that has a backlit keypad. To prolong battery life between charges, cell phones typically enter a sleep mode in which the backlight is turned off after a period of time. Should a user want to use the phone in the dark, the user must first press a key at random in order to awaken the phone and turn on the backlight. With proximity detection, the keypad would be illuminated as the user reached for the phone. Unfortunately, smaller devices such as cell phones may not have the space available for a proximity sensor that is large enough to sense the approach of an object.

SUMMARY

Embodiments in accordance with the present invention pertain to a capacitive sensing apparatus that includes capacitive sensor electrodes (e.g., buttons, one-dimensional sensors, and two-dimensional sensors), and a "combined guard and sensing electrode" that is disposed proximate to the capacitive sensor electrodes. The combined guard and sensing electrode has at least a first operating mode and a second operating mode. In the first operating mode, the combined guard and sensing electrode can detect an object (e.g., a user's finger) at a distance that is greater than the distance at which the object can be sensed by the capacitive sensor electrodes. Thus, for example, in the first operating mode, the combined guard and sensing electrode can detect the presence of an object before the object is brought into contact with the capacitive sensor electrodes. In a similar manner, in the first operating mode, the combined guard and sensing electrode can detect the absence of an object. In the second operating mode, the combined guard and sensing electrode can electrically guard the capacitive sensor electrodes. Because the same electrode can serve dual purposes—as a proximity sensor and a guard—proximity detection can be included as a feature in smaller electronic devices without taking up additional space.

BRIEF DESCRIPTION OF THE DRAWINGS

FIG. 4 is a flowchart of a method for operating a capacitive sensing apparatus according to an embodiment of the invention.

The drawings referred to in this description should not be understood as being drawn to scale except if specifically noted.

DETAILED DESCRIPTION

Reference will now be made in detail to embodiments of the invention, examples of which are illustrated in the accompanying drawings. While the invention will be described in conjunction with embodiments, it will be understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of the present invention, numerous specific details are set forth in order to provide a thorough understanding of the present invention. However, it will be obvious to one of ordinary skill in the art that the present invention may be practiced without these specific details. In other instances, well known methods, procedures, components, and circuits have not been described in detail as not to unnecessarily obscure aspects of the present invention.

Figure 1:
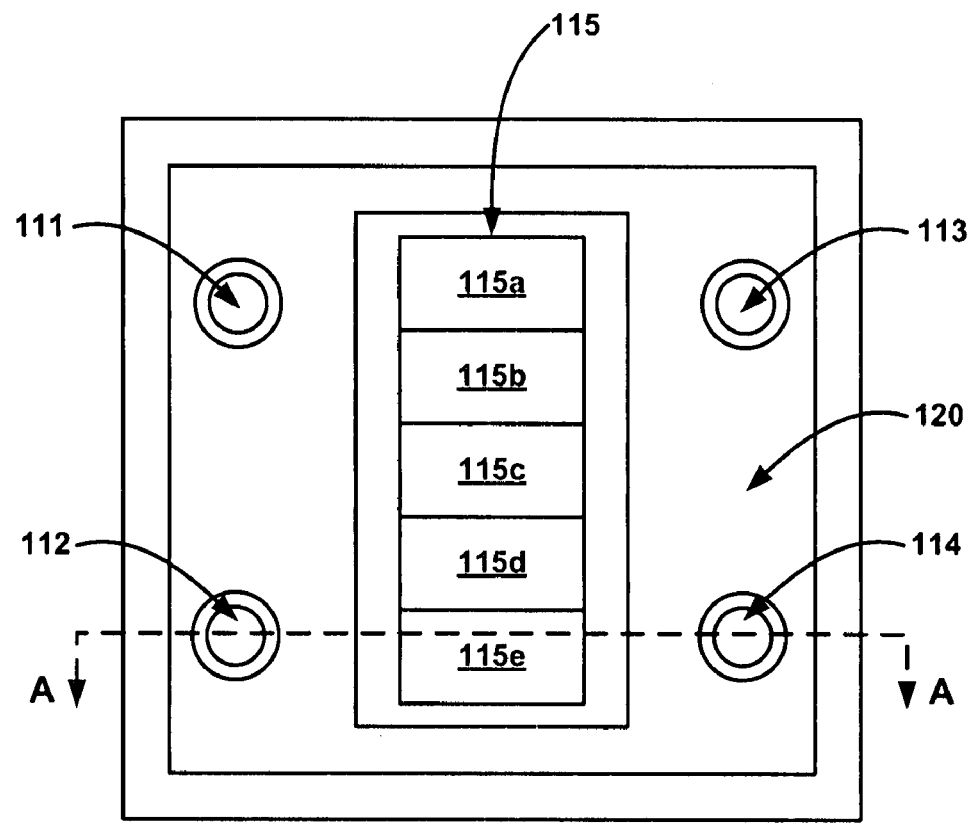
FIG. 1 illustrates elements of a capacitive sensing apparatus according to an embodiment of the invention.
Figure 5:
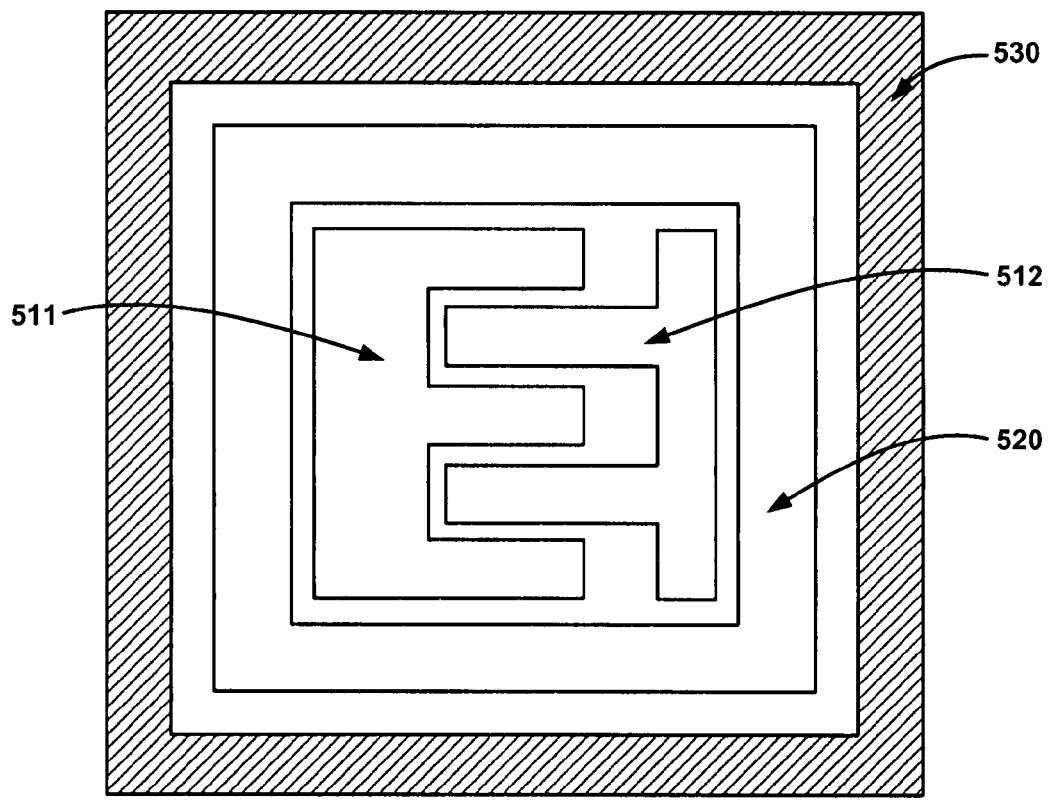
FIG. 5 illustrates elements of a capacitive sensing apparatus according to another embodiment of the invention.

FIG. 1 illustrates elements of a capacitive sensing apparatus 100 according to embodiments of the invention. In the example of FIG. 1, capacitive sensing apparatus 100 may be referred to as an "absolute capacitive sensor," which is discussed further in conjunction with FIGS. 3A and 3B, below. FIG. 5, below, illustrates an alternate embodiment that may be referred to as a "transcapacitive sensor." An absolute capacitive sensor operates by detecting changing field lines coupling to it and the charge transferred onto it when the sensor electrode is modulated relative to its local ground.

Continuing with reference to FIG. 1, only certain elements relevant to the discussion herein are shown. More specifically, in the example of FIG. 1, only capacitive sensor electrodes 111, 112, 113, 114 and 115 (115a-115e) and combined guard and sensing electrode 120 are shown. The number, arrangement, shapes and relative sizes of the capacitive sensor electrodes can be different from what is shown in FIG. 1.

In general, capacitive sensing apparatus 100 can be used as an interface for an electronic device (which may be referred to as a "host system") such as, but not limited to, a computing device (e.g., desktop, laptop, notebook, etc.), a handheld device (e.g., cell phone, smart phone, music player, game player, camera, etc.), or peripheral device (e.g., keyboard, remote control, etc.). Capacitive sensing apparatus 100 can be located anywhere on an electronic device, and generally can be integrated within the general form factor of a conventional device.

In general, capacitive sensing apparatus 100 is incorporated as part of a sensing system that can be used, for example, to determine whether or not an object (e.g., a user's finger, a probe, a stylus, etc.) is nearby (that is, within sensing range). In general, such a sensing system can include: sensor electrodes as described herein; a sensor coupled to the electrodes that converts analog capacitive signals into digital outputs; a microcontroller or similarly capable device that processes the digital outputs; and a host system such as that mentioned above. The elements of a sensing system may be implemented within a single device or distributed across more than one device. The latter implementation may be exemplified by a handheld remote control device that includes the sensor electrodes and perhaps the analog-to-digital conversion of the signal but does not include the processing intelligence; instead, the processing of the output signals is done by a separate device (e.g., a component of the host device). Similarly, the sensor and microcontroller can be combined with the host in a single package (e.g., in a cell phone) or separated in a variety of ways.

In the example of FIG. 1, capacitive sensor electrodes 111-114 are implemented as capacitive buttons (e.g., a keypad) that require only a slight touch to activate or that can be activated when an object is brought within sensing range. In the example of FIG. 1, capacitive sensor electrode 115 is implemented as a multi-sensor one-dimensional or two-dimensional sensor (e.g., a strip touchpad, or multi-element button) that can be activated in the manner just described. More specifically, capacitive sensor electrode 115 may be formed using multiple electrodes 115a-115e that are electrically insulated from each other except for a downstream connection to, for example, an application specific integrated circuit (ASIC). Capacitive sensor electrode 115 can be used to determine a position of an object proximate to a sensing region defined by the capacitive sensor electrode 115 (e.g., the fractional distance along a strip of a finger touching a dielectric over the electrodes), and may also be used to determine a rate of movement of an object across the sensing region (e.g., reporting a relative motion for each some small fractional motion along a strip). Each of the capacitive sensor electrodes 111-114 (including buttons) may also be formed using multiple electrodes (not shown).

The capacitive sensor electrodes 111-115 may be mounted under a protective layer of material (e.g., plastic, glass, etc.). Some type of visual feedback for the interface may be provided; for example, the capacitive sensor electrodes 111-115 may be illuminated in some manner (e.g., they can be backlit, frontlit, or an area surrounding each electrode can be illuminated). Different colors, patterning, or grouping of electrodes into different areas, may be used to indicate different functions or modes.

In the embodiment of FIG. 1, when an object is brought within range of, or in contact with, one or more of the capacitive sensor electrodes 111-115, a capacitance is induced between the object and the electrode(s) (see FIG. 3A, below, for example) and a change in the electric fields is detected. In one embodiment, the capacitive sensor electrodes 111-115 are driven by current excitation and a change in voltage due to the object is measured. In another embodiment, the capacitive sensor electrodes 111-115 are driven by voltage excitation and a change in current due to the object is measured. Signal(s) from the capacitive sensor electrodes 111-115 can be translated into, for example, cursor movements, scrolling actions, button presses, and the like, which are in turn communicated to the host system. A variety of linear and non-linear filters, thresholds or ballistics may be applied to the sensor signals or the microcontroller output, and temporal and spatial recognition may be implemented. Capacitive sensor electrodes 111-115 can thus provide functionality similar to the functionality provided by mechanical buttons, keys, rockers, sliders, a mouse, and the like. Note that a driving current need not be constant, and could also be described by a charge driven over a specified time, and similarly a measured current may be filtered or integrated, and could also be described as a charge measured over a specified time.

Continuing with reference to FIG. 1, capacitive sensing apparatus 100 includes a combined guard and sensing electrode 120. In general, the combined guard and sensing electrode 120 is large relative to the sizes of the capacitive sensor electrodes 111-115. In one embodiment, combined guard and sensing electrode 120 lies in the same plane as the capacitive sensor electrodes 111-115 and occupies essentially all of the area in that plane not occupied by the electrodes 111-115. In the example of FIG. 1, the combined guard and sensing electrode 120 is shown as completely surrounding each of the capacitive sensing electrodes 111-115. However, this need not be the case. In one embodiment, the combined guard and sensing electrode 120 surrounds at least a majority of the perimeter of each capacitive sensing electrode 111-115.

Combined guard and sensing electrode 120 has at least two operating modes, which may be referred to herein as a first or sensing mode, and as a second or guarding mode. In the sensing mode, an output of the capacitive sensing apparatus 100 changes when proximity of an object to electrode 120 is detected. In the guarding mode, the electrode 120 is controlled with a low impedance output to a voltage (or voltage waveform) to shield the capacitive sensor electrodes 111-115 from interfering signals and to reduce the effect of the electrode 120 on the other sensors. Combined guard and sensing electrode 120 can transition between operating modes, as will be described. The combined guard and sensing electrode 120 may operate at higher impedance in sensing mode than in guarding mode. In one embodiment, the voltage waveform that drives the combined guard and sensing electrode 120 and the voltage waveform that drives the capacitive sensor electrodes 111-115 are similar in shape and synchronized. For example, the shape of one waveform (e.g., the "guard") may be squarish and the shape of the other (e.g., "sensing") waveform may be trapezoidal. The waveforms can be offset in voltage if the voltage swing of each is about the same.

In the first (sensing) operating mode, combined guard and sensing electrode 120 is used to detect whether an object (a user's finger or hand, a stylus, etc.) is in proximity to the apparatus 100. The combined guard and sensing electrode 120 can be calibrated (designed) to detect a certain-sized object at a certain range, and the capacitive sensor electrodes 111-115 can also be calibrated to detect such an object at a certain range. However, combined guard and sensing electrode 120 can be configured to detect an object at a distance (range) that is greater than the distance at which the same object can be detected by the capacitive sensor electrodes 111-115. In other words, for example, with combined guard and sensing electrode 120 in the first (sensing) operating mode, an object that is brought closer to capacitive sensing apparatus 100 will be detected (sensed) by combined guard and sensing electrode 120 before it is detected by the capacitive sensor electrodes 111-115. Importantly, with combined guard and sensing electrode 120 in place, contact with the sensing apparatus 100 may not be required for actuation; otherwise, contact with the capacitive sensor electrodes 111-115 may have been required for actuation. Consequently, the capacitive sensor electrodes 111-115, or a function associated with those electrodes, can be activated earlier than conventionally possible. In one implementation, the combined guard and sensing electrode 120 has a sensing range (e.g., out of plane) that is 2-10 times greater than that of the capacitive sensor electrodes 111-115. The combined guard and sensing electrode 120 and capacitive sensor electrodes 111-115 can also be used to determine the absence of an object by using a variety of filters (e.g., detecting a low signal or reduced variance of a signal, or other more complex linear and non-linear digital filters and heuristics).

In the second (guarding) operating mode, combined guard and sensing electrode 120 guards the capacitive sensor electrodes 111-115. As a guard, the voltage (or current) on the combined guard and sensing electrode 120 moves in the same direction, and preferably by the same amount, as the voltage on the capacitive sensor electrodes 111-115 to minimize its effect, and does so with a low impedance to minimize any unwanted effects. Consequently, combined guard and sensing electrode 120 can be used to shield the capacitive sensor electrodes 111-115 from unwanted or interfering electric fields. As a guard, the combined guard and sensing electrode 120 may also reduce the sensitivity of a capacitive sensor electrode to a change in state of another (e.g., neighboring) capacitive sensor electrode, and reduce the sensitivity of the capacitive sensor electrodes 111-115 to environmental effects (e.g., temperature, moisture, emollients and the like) that may affect the performance of the apparatus 100, while its own field coupling has minimal effects on the sensors. Combined guard and sensing electrode 120 can act as a shield for the capacitive sensor electrodes 111-115, to protect them from extraneous (externally or internally generated) fields in addition to unwanted or interfering electric fields with minimal other effects on the sensors.

Combined guard and sensing electrode 120 can transition back and forth between the first and second operating modes depending on circumstances. For example, with combined guard and sensing electrode 120 in first (sensing) mode, upon detecting the presence of an object, the electrode automatically switches to the second (guarding) mode. More specifically, in one embodiment, a microcontroller or similarly capable device can receive a signal from combined guard and sensing electrode 120 and, in response, can switch the electrode from one mode to another, so that the electrode transitions from a high impedance (sensing) state to a low impedance (guarding) state. In another embodiment, in which the sensing state is also driven with a low impedance, a different and less complex low impedance driving circuit (e.g., switches to power supply or buffered reference voltages) may be used in the guarding state, or some of the steps that generally occur during processing of the digital signals for sensing may be stopped, ignored or substantially altered (e.g., performed at a much lower rate) when the high resolution proximity sensing mode is not required.

Other mechanisms, generally known to those skilled in the art, can be used to transition the combined guard and sensing electrode 120 between its sensing and guarding modes. For example, in one embodiment, the combined guard and sensing electrode 120 can be electrically coupled to a guard pin that drives a guard signal. The combined guard and sensing electrode 120 is in sensing mode in the absence of a signal on the guard pin. Upon detecting a proximate object, the guard signal is turned on, causing the combined guard and sensing electrode 120 to operate as a guard, and the output of the sensor can be ignored. An external pin is not required, and switches that are internal to the capacitive sensing system may also implement a similar scheme by alternately connecting unused sensors to a pin in one mode (e.g., sensing mode) and connecting a low impedance buffer in another mode (e.g., guarding mode). Similarly, a variety of methods of controlling the desired state of the sensor may be used, including electrical signaling from the host or other devices.

In one embodiment, with combined guard and sensing electrode 120 in the second (guarding) mode, the microcontroller keeps track of how long an object's presence has not been detected by capacitive sensor electrodes 111-115—once that amount of time reaches a prescribed threshold, the microcontroller can switch the mode of the combined guard and sensing electrode 120 so that the electrode transitions back to a high impedance (sensing) state. In other words, if an object is not detected for a certain period of time, then the combined guard and sensing electrode 120 enters sensing mode, by much the same decision procedure used to place a device in a low power mode. In one such embodiment, the host system is also triggered to enter its low power mode when the combined guard and sensing electrode 120 enters its sensing mode. Other inputs, sensors or switches or signals from other devices may also be used for this detection. For example, an absence of signals from a keyboard for a period of time because a user has stopped typing during that period may indicate that the user is no longer present, and so the absence of signals from the keyboard can be used as a trigger to enter sensing mode. The absence of such signals (e.g., low variation, or other filtering and heuristic methods) can be subjected to a timer (that is, the signals may need to be absent for a prescribed period of time), to account for situations in which the user pauses from typing for brief periods, for example.

In another embodiment, the operating mode of the combined guard and sensing electrode 120 is tied to the operating mode of the host device—if the host device is in a sleep mode (e.g., has entered a low power mode), then the combined guard and sensing electrode 120 is in sensing mode; and if the host device is awake, then the combined guard and sensing electrode 120 is in guarding mode. Thus, the combined guard and sensing electrode 120 can transition from sensing mode to guarding mode in response to an event on the host system that causes the host system to awaken, and from guarding mode to sensing mode in response to an event on the host system that causes the host system to sleep. For example, if the host system is a computer with a mouse, then the computer system can be awakened by someone moving the mouse, which in turn causes the combined guard and sensing electrode 120 to change operating mode. Similarly, a period of inactivity may cause the host system to sleep and the combined guard and sensing electrode 120 to transition from guarding mode to sensing mode. In response to combined guard and sensing electrode 120 sensing proximity of an object, the host system might later be awakened to again change the operating mode back to guarding mode. A sleep mode is generally a lower power mode where sensing, signal processing, communication rates, or other device activities are reduced to minimize their impact on a device (e.g., to minimize interference, power dissipation, indicate reduced functionality, or other performance tradeoffs).

In one embodiment, with the combined guard and sensing electrode 120 in sensing mode, the capacitive sensor electrodes 111-115, or a function associated with those electrodes, may be deactivated (e.g., ignored, disconnected, etc.). Conversely, the capacitive sensor electrodes 111-115 may be activated when the combined guard and sensing electrode 120 transitions to guarding mode, or vice versa. The capacitive sensor electrodes 111-115, or a function associated with those electrodes, can then be activated when the combined guard and sensing electrode 120 senses a proximate object. For example, as mentioned above, capacitive sensor electrodes may be used as capacitive buttons to implement multi-media controls (e.g., a keypad on a cell phone, laptop, etc.), which may be illuminated in some manner when activated and be differently illuminated when inactivated. After some period of time, the cell phone enters a sleep state, causing the illumination of the capacitive sensor electrodes to be turned off and also causing the combined guard and sensing electrode 120 to enter into sensing mode. In the present embodiment, the combined guard and sensing electrode 120 may then detect the approach of an object (e.g., a user's hand or finger), awakening the host system and illuminating the capacitive sensor electrodes (e.g., in order to highlight their respective functions) before the capacitive sensor electrodes are touched or detect the proximate object themselves.

In another embodiment, with the combined guard and sensing electrode 120 in sensing mode, the capacitive sensor electrodes 111-115, or a function associated with those electrodes, may be deactivated (conversely, the capacitive sensor electrodes 111-115 are activated when the combined guard and sensing electrode transitions to guarding mode, or vice versa). Again, consider an example in which capacitive sensor electrodes are used as capacitive buttons to implement multi-media controls (e.g., as a keypad on a cell phone, portable media player, etc.). As noted above, to use a capacitive button, a user does not have to apply pressure to the button, but instead only needs to either slightly touch the button or get within sensing range of the button. Thus, a situation may occur where a button is actuated inadvertently when the user holds the cell phone up against or near enough to his or her cheek while talking, places the cell phone in a pocket, etc. In the present embodiment, to avoid this situation, the combined guard and sensing electrode 120, when in sensing mode, may deactivate the capacitive sensor electrodes 111-114 when a larger object approaches at a greater distance, in order to prevent the sensor electrodes 111-114 from being actuated inadvertently. For example, in a situation where a large nearby object activates the combined guard and sensing electrode 120 before the sensor electrodes 111-115 are activated, the sensor electrodes may be deactivated. Conversely, one of the sensor electrodes 111-115 may activate before the combined guard and sensing electrode 120, and so the latter's mode may be changed to guarding.

In yet another embodiment, the capacitive sensor electrodes 111-115, or a function associated with those electrodes, are activated regardless of the operating mode of the combined guard and sensing electrode 120. Thus, for example, both the set of capacitive sensor electrodes 111-115 and the combined guard and sensing electrode 120 can be used for proximity detection, with the combined guard and sensing electrode transitioning to guarding mode in response to an object being detected. Multiple sensor modes may be implemented for the combined guard and sensing electrode 120 (e.g., it may detect distant objects in one mode, and detect nearby objects in another).

In general, the combined guard and sensing electrode can be used to control a function that can be transitioned (e.g., toggled) between a first state and a second state. The function can be placed in its first state when the combined guard and sensing electrode 120 is transitioned from guarding mode to sensing mode, and can be transitioned to its second state when the combined guard and sensing electrode 120 is transitioned from sensing mode to guarding mode.

Figure 2:
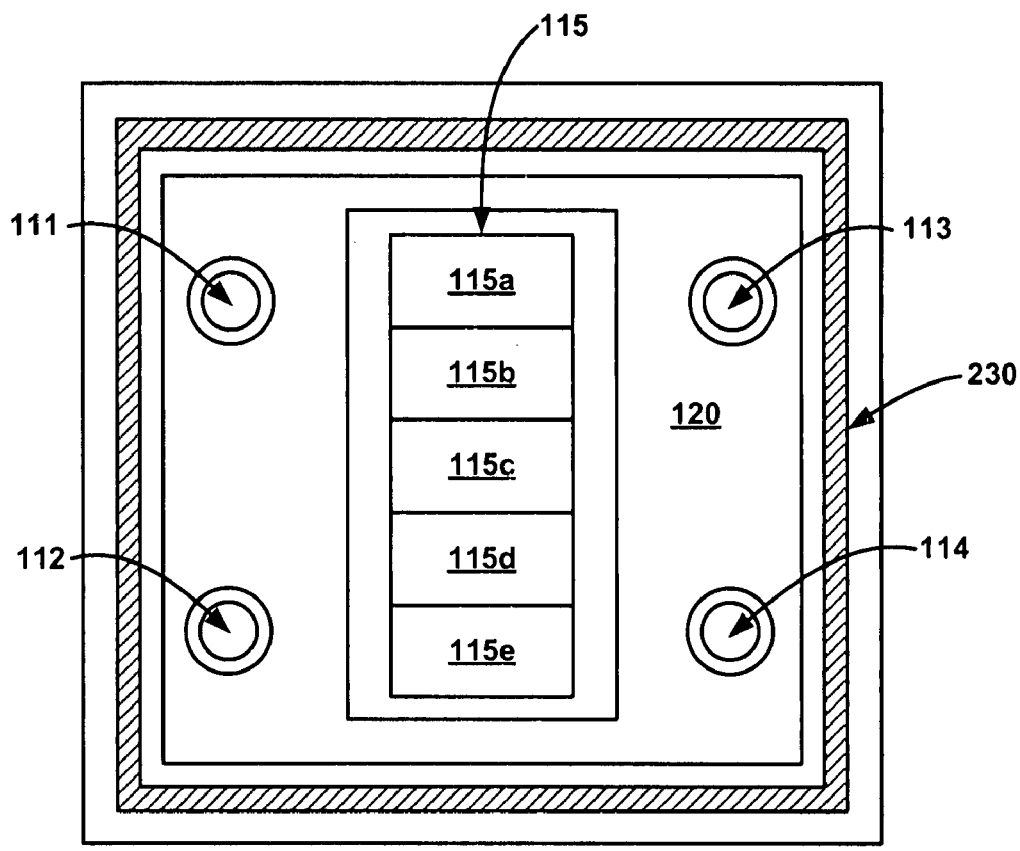
FIG. 2 illustrates elements of a capacitive sensing apparatus according to another embodiment of the invention.

FIG. 2 illustrates elements of a capacitive sensing apparatus 200 according to another embodiment of the invention. Capacitive sensing apparatus includes capacitive sensor electrodes 111-115 and combined guard and sensing electrode 120, as previously described herein. In contrast to apparatus 100 of FIG. 1, apparatus 200 also includes a guard ring 230 that guards the combined guard and sensing electrode 120. In contrast to combined guard and sensing electrode 120, the guard ring 230 is always in guarding mode (e.g., in a low impedance state).

Figure 3A:
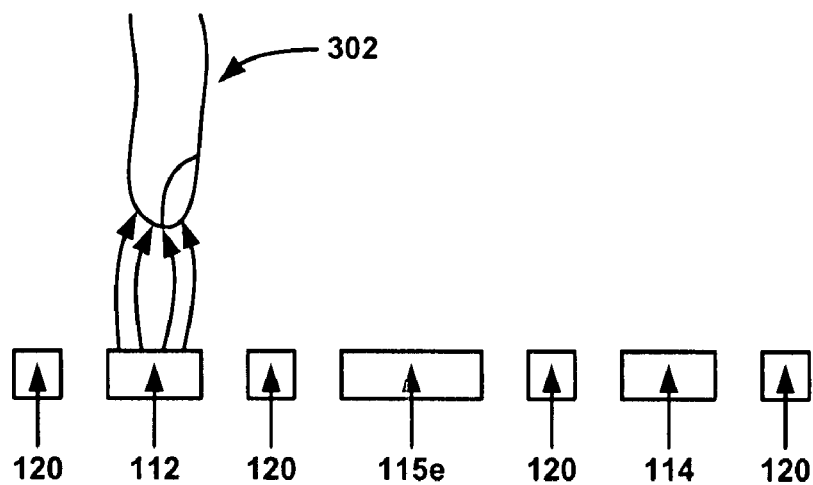
FIGS. 3A and 3B illustrate a cross-section of a portion of a capacitive sensing apparatus according to an embodiment of the invention.

FIG. 3A illustrates a cross-section A-A of a portion of capacitive sensing apparatus 100 of FIG. 1 according to an embodiment of the invention. The example of FIG. 3A illustrates an absolute capacitive sensor in which the combined guard and sensing electrode 120 guards capacitive sensor electrodes 112 and 114-115. When the object 302 is brought within range of capacitive sensor electrode 112, for example, a significant capacitive coupling between the electrode 112 and the object 302 is induced. In one embodiment, the capacitive sensor electrode 112 is driven by current excitation and a change in voltage due to the presence of object 302 is measured. In another embodiment, the capacitive sensor electrode 112 is driven by voltage excitation and a change in current due to the presence of object 302 is measured.

Figure 3B:
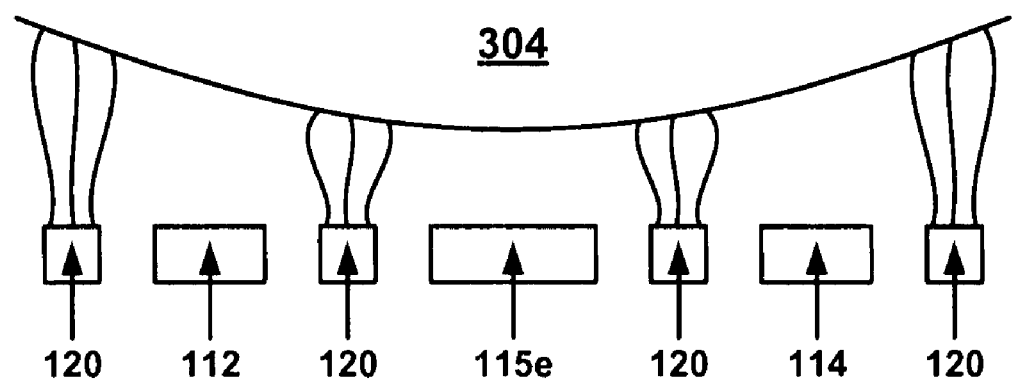

FIG. 3B illustrates capacitive sensing apparatus 100 in cross-section, but with a larger object 304 (e.g., a palm, cheek, etc.) approaching the apparatus at a further distance. When the object 304 is within range of the electrode 120, a significant capacitive coupling between the electrode 120 and the object 304 is induced. In one embodiment, the electrode 120 is driven by current excitation in its sensing mode, and a change in voltage due to the presence of object 304 is measured. In another embodiment, the electrode 120 is driven by voltage excitation and a change in current due to the presence of object 304 is measured in its sensing mode.

FIG. 4 is a flowchart 400 of a method for operating a capacitive sensing apparatus according to an embodiment of the invention. Although specific steps are disclosed in flowchart 400, such steps are exemplary. That is, various other steps or variations of the steps recited in flowchart 400 can be performed. The steps in flowchart 400 may be performed in an order different than presented. In one embodiment, flowchart 400 can be implemented by capacitive sensing apparatus 100 of FIG. 1.

In block 410 of FIG. 4, with reference also to FIG. 1, a combined guard and sensing electrode 120 is placed in a first operating mode if a signal (either capacitively sensed or otherwise generated) is absent for a prescribed length of time, where the signal indicates an object within sensing range of the apparatus 100. In the first operating mode, the combined guard and sensing electrode 120 can detect an object within sensing range. The combined guard and sensing electrode 120 remains in the first operating mode until an object is detected. Note that a signal could also be transmitted to indicate that an object is not present.

In block 420, the combined guard and sensing electrode 120 transitions to a second operating mode in response to detecting an object. In the second operating mode, the combined guard and sensing electrode 120 can electrically guard capacitive sensor electrodes 111-115.

In one embodiment, the capacitive sensor electrodes 111-115, or a function associated therewith, are disabled when the combined guard and sensing electrode 120 is in the first operating mode and enabled when the combined guard and sensing electrode 120 is in the second operating mode. In another embodiment, the capacitive sensor electrodes 111-115, or a function associated therewith, are enabled when the combined guard and sensing electrode 120 is in the first operating mode and disabled when the combined guard and sensing electrode 120 is in the second operating mode. In yet another embodiment, the capacitive sensor electrodes 111-115 are enabled for both operating modes of the combined guard and sensing electrode.

FIG. 5 illustrates elements of a capacitive sensing apparatus 500 according to another embodiment of the invention. In the example of FIG. 5, capacitive sensing apparatus 500 may be referred to as a "transcapacitive sensor." A transcapacitive sensor operates by detecting changing field lines coupling a modulated transmitting electrode and the charge transferred by it onto a sensing electrode. Only certain elements relevant to the discussion herein are shown. More specifically, in the example of FIG. 5, only capacitive sensor electrodes 511 and 512, combined shield and sensing electrode 520, and guard ring 530 are shown. The number, arrangement, shapes and relative sizes of capacitive sensor electrodes can be different from what is shown in FIG. 1, and there may be other elements in addition to those shown in FIG. 5.

In a transcapacitive system, a guard may be at a constant voltage, which may be a stable reference voltage (e.g., ground), in which case the guard is often referred to simply as a shield since no modulation is necessary to reduce its effect on a sensor. In general, guard ring 530 may be a guard or a shield.

Field lines can be produced by electrode 511 and will terminate at electrode 512. A proximate object will interrupt the field lines, in essence absorbing a portion of the field lines, so that less signal is received at electrode 512 from electrode 511. As mentioned previously herein, the transmitter electrode 511 may be driven by voltage excitation, in which case a change in voltage at the sensing electrode 512 due to the proximate object can be measured if it is a high impedance sensor. Alternately, the electrode 512 may be maintained at a voltage in a low impedance sensor, in which case a change in current at the sensing electrode due to the proximate object can be measured.

In general, the combined shield and sensing electrode 520 is large relative to the sizes of the capacitive sensor electrodes 511-512. In one embodiment, combined shield and sensing electrode 520 lies in the same plane as the capacitive sensor electrodes 511-512 and occupies essentially all of the area in that plane not occupied by the electrodes 511-512.

Combined shield and sensing electrode 520 has at least two operating modes, which may be referred to herein as a first (or sensing) mode, and a second (or shielding or grounding) mode. The combined shield and sensing electrode 520 may operate at higher impedance in sensing mode than in grounding mode. In the sensing mode, the combined shield and sensing electrode 520 could be acting as part of a transcapacitive sensor (e.g., either as the transmitter or sensor), or it could be operating as an absolute capacitive sensor.

As a sensor, combined shield and sensing electrode 520 is used to detect whether an object (a user's finger or hand, a stylus, etc.) is in proximity to the apparatus 500, in a manner similar to that described above in conjunction with FIG. 1. When not in sensing mode, combined shield and sensing electrode 520 serves as a ground plane to shield the electrodes 511-512 from extraneous (external) fields.

Combined shield and sensing electrode 520 can transition back and forth between the first and second operating modes depending on circumstances. For example, with combined shield and sensing electrode 520 in first (sensing) mode, upon detecting the approach of an object, the electrode automatically switches to the second (shielding) mode. The combined shield and sensing electrode 520 can transition back to sensing mode if, for example, an object is not detected for a period of time.

In general, combined shield and sensing electrode 520 operates in a manner similar to that described above in conjunction with FIG. 1. Furthermore, combined shield and sensing electrode 520 can be used to control a function that can be transitioned (e.g., toggled) between a first state and a second state in a manner similar to that described above in conjunction with FIG. 1.

In summary, according to embodiments of the invention, a single electrode (e.g., electrode 120 or 520) can be operated in different modes—as a far field proximity sensor, as a near field proximity sensor, and/or as a guard or ground plane. In the different modes, the electrode can be used to turn on or activate devices or functions, turn off or inhibit devices or functions, and/or guard/shield other sensor electrodes. Because the same electrode has multiple uses, features such as proximity detection can be incorporated into relatively small devices without taking up additional space that would otherwise be required by a shielding or guarding electrode.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the claims appended hereto and their equivalents.

What is claimed is:

1. A capacitive sensing apparatus comprising:
a plurality of capacitive sensor electrodes that are operable for sensing an object that is within a first distance of said plurality of sensor electrodes; and
a combined guard and sensing electrode disposed proximate to said plurality of sensor electrodes and having associated therewith at least a first operating mode and a second operating mode, wherein in said first operating mode said combined guard and sensing electrode is operable for detecting said object at a second distance that is greater than said first distance, and wherein in said second operating mode said combined guard and sensing electrode is operable for electrically guarding at least one of said capacitive sensor electrodes.

2. The apparatus of claim 1 wherein said combined guard and sensing electrode is configured to switch from said first operating mode to said second operating mode in response to detecting said object.

3. The apparatus of claim 1 wherein said combined guard and sensing electrode is configured to switch from said second operating mode to said first operating mode in response to determining absence of said object.

4. The apparatus of claim 1 further comprising a guard electrode in proximity to said combined guard and sensing electrode and operable for electrically guarding said combined guard and sensing electrode.

5. The apparatus of claim 1 wherein said plurality of capacitive sensor electrodes is selected from the group consisting of: buttons; one-dimensional sensors; and two-dimensional sensors.

6. The apparatus of claim 1 wherein said plurality of capacitive sensor electrodes is disabled when said combined guard and sensing electrode is in said first operating mode and enabled when said combined guard and sensing electrode is in said second operating mode.

7. The apparatus of claim 1 wherein said combined guard and sensing electrode transitions from an enabled state to a disabled state in response to said combined guard and sensing electrode detecting presence of said object while in said first operating mode, and wherein said combined guard and sensing electrode transitions from said first operating mode to said second operating mode in response to said plurality of capacitive sensor electrodes sensing presence of said object.

8. The apparatus of claim 1 wherein said plurality of capacitive sensor electrodes is enabled when said combined guard and sensing electrode is in said first operating mode and enabled when said combined guard and sensing electrode is in said second operating mode.

9. The apparatus of claim 1 wherein said plurality of capacitive sensor electrodes guards said combined guard and sensing electrode when said combined guard and sensing electrode is in said first operating mode.

10. The apparatus of claim 1 wherein, in said first operating mode, said plurality of capacitive sensor electrodes and said combined guard and sensing electrode are driven by current excitation and measured with voltage sensing circuitry.

11. The apparatus of claim 1 wherein, in said first operating mode, said plurality of capacitive sensor electrodes and said combined guard and sensing electrode are driven by voltage excitation and measured with current sensing circuitry.

12. The apparatus of claim 1 wherein said combined guard and sensing electrode encompasses a majority of a perimeter of at least one of said capacitive sensor electrodes.

13. A capacitive sensing apparatus comprising:
a combined guard and sensing electrode that has associated therewith a first operating mode and a second operating mode; and
a plurality of capacitive sensor electrodes disposed proximate to said combined guard and sensing electrode and having associated therewith a function that can be transitioned between a first state and a second state depending on whether an object is within sensing range of said combined guard and sensing electrode; wherein, when said function is placed in said first state, said combined guard and sensing electrode is transitioned from said second operating mode to said first operating mode in which said combined guard and sensing electrode is operable for detecting an object within sensing range of said combined guard and sensing electrode; and wherein, in response to said combined guard and sensing electrode detecting an object, said function is transitioned to said second state and said combined guard and sensing electrode is transitioned from said first operating mode to said second operating mode in which said combined guard and sensing electrode is operable for electrically guarding said plurality of capacitive sensor electrodes.

14. The apparatus of claim 13 wherein said combined guard and sensing electrode is configured to switch from said first operating mode to said second operating mode in response to detecting said object.

15. The apparatus of claim 13 wherein said combined guard and sensing electrode is configured to switch from said second operating mode to said first operating mode in response to determining absence of said object.

16. The apparatus of claim 13 wherein said combined guard and sensing electrode is configured to switch from said second operating mode to said first operating mode after a prescribed period of time.

17. The apparatus of claim 13 further comprising a guard electrode in proximity to said combined guard and sensing electrode and operable for electrically guarding said combined guard and sensing electrode.

18. The apparatus of claim 13 wherein said plurality of capacitive sensor electrodes is selected from the group consisting of: buttons; one-dimensional sensors; and two-dimensional sensors.

19. The apparatus of claim 13 wherein said first state is a disabled state and wherein said second state is an enabled state.

20. The apparatus of claim 19 wherein said plurality of capacitive sensor electrodes guard said combined guard and sensing electrode when said combined guard and sensing electrode is in said first operating mode.

21. The apparatus of claim 13 wherein, in said first operating mode, said plurality of capacitive sensor electrodes and said combined guard and sensing electrode are driven by current excitation and measured with voltage sensing circuitry.

22. The apparatus of claim 13 wherein, in said first operating mode, said plurality of capacitive sensor electrodes and said combined guard and sensing electrode are driven by voltage excitation and measured with current sensing circuitry.

23. The apparatus of claim 13 wherein said combined guard and sensing electrode encompasses a majority of a perimeter of at least one of said capacitive sensor electrodes.

24. A method of operating a capacitive sensing apparatus, said method comprising:
placing a combined guard and sensing electrode of said apparatus in a first operating mode if a signal that indicates an object is within sensing range of said apparatus is absent for a prescribed length of time, wherein in said first operating mode said combined guard and sensing electrode is operable for detecting an object within said sensing range and wherein said combined guard and sensing electrode remains in said first operating mode until an object is detected; and
placing said combined guard and sensing electrode in a second operating mode in response to detecting an object, wherein in said second operating mode said combined guard and sensing electrode is operable for electrically guarding a plurality of capacitive sensor electrodes of said apparatus.

25. The method of claim 24 further comprising:
disabling said plurality of capacitive sensor electrodes when said combined guard and sensing electrode is in said first operating mode; and
enabling said plurality of capacitive sensor electrodes when said combined guard and sensing electrode is in said second operating mode.

26. The method of claim 24 further comprising enabling said plurality of capacitive sensor electrodes when said combined guard and sensing electrode is in said first operating mode, wherein said plurality of capacitive sensor electrodes remains enabled when said combined guard and sensing electrode is in said second operating mode.

27. The method of claim 24 further comprising:
disabling said plurality of capacitive sensor electrodes when said combined guard and sensing electrode is in said first operating mode; and
using said plurality of capacitive sensor electrodes to guard said combined guard and sensing electrode.

28. The method of claim 24 further comprising:
disabling said plurality of capacitive sensor electrodes when said combined guard and sensing electrode is in said first operating mode; and
using said plurality of electrodes to determine a state of said combined guard and sensing electrode.

* * * * *